United States Patent
Sugimori et al.

(10) Patent No.: US 9,921,250 B2
(45) Date of Patent: Mar. 20, 2018

(54) STRUCTURE OF MOUNTING CURRENT SENSOR TO BATTERY CABLE

(71) Applicant: YAZAKI CORPORATION, Minato-ku, Tokyo (JP)

(72) Inventors: Yasuhiro Sugimori, Shimada (JP); Kunihiro Harada, Shimada (JP); Yasuo Shimizu, Shimada (JP)

(73) Assignee: YAZAKI CORPORATION, Tokyo (JP)

( * ) Notice: Subject to any disclaimer, the term of this patent is extended or adjusted under 35 U.S.C. 154(b) by 7 days.

(21) Appl. No.: 14/934,761

(22) Filed: Nov. 6, 2015

(65) Prior Publication Data
US 2016/0061865 A1 Mar. 3, 2016

Related U.S. Application Data

(62) Division of application No. 13/855,785, filed on Apr. 3, 2013, now abandoned.

(30) Foreign Application Priority Data

Apr. 5, 2012 (JP) .................................. 2012-086000

(51) Int. Cl.
*G01R 1/04* (2006.01)
*G01R 19/00* (2006.01)
(Continued)

(52) U.S. Cl.
CPC .......... *G01R 19/0092* (2013.01); *B29C 65/02* (2013.01); *G01R 1/04* (2013.01);
(Continued)

(58) Field of Classification Search
CPC ............. B29C 65/02; B29L 2031/3462; G01R 15/183; G01R 19/0092; G01R 1/04; G01R 31/3696
See application file for complete search history.

(56) References Cited

U.S. PATENT DOCUMENTS 8,917,085 B2 * 12/2014 Hashio ............... G01R 1/06788
174/59
2003/0169031 A1 * 9/2003 Viola ................... G01R 35/005
324/156
(Continued)

FOREIGN PATENT DOCUMENTS

JP    H04-102067 A    4/1992
JP    H09-277853 A    10/1997
(Continued)

OTHER PUBLICATIONS

Japanese Office Action dated Feb. 16, 2016 in the counterpart Japanese patent application.
(Continued)

*Primary Examiner* — Minh Trinh
(74) *Attorney, Agent, or Firm* — Metrolexis Law Group, PLLC

(57) ABSTRACT

A structure of mounting a current sensor to a battery cable includes a battery cable, a thermal fusion bonding tape wound around an outer circumference of the battery cable, and a current sensor. The current sensor includes a housing including a current detecting part configured to detect a current flowing through the battery cable, and a holder configured to hold and compress a thermal fusion bonding tape mounting portion in cooperation with the housing to deform a cross-sectional shape of the thermal fusion bonding tape mounting portion into an elliptical shape. The thermal fusion bonding tape mounting portion is a portion where the thermal fusion bonding tape is wound around the battery cable. Upon a compression between the housing and the holder being released, the elliptical shape of the cross-sectional shape of the thermal fusion bonding tape mounting portion is maintained.

9 Claims, 7 Drawing Sheets

(51) Int. Cl.
*G01R 15/18* (2006.01)
*B29C 65/02* (2006.01)
*H01M 10/42* (2006.01)
*G01R 31/36* (2006.01)
*B29L 31/34* (2006.01)

(52) U.S. Cl.
CPC ...... *G01R 15/183* (2013.01); *H01M 10/4285* (2013.01); *B29L 2031/3462* (2013.01); *G01R 31/3696* (2013.01)

(56) References Cited

U.S. PATENT DOCUMENTS

| | | | |
|---|---|---|---|
| 2010/0315066 A1 | 12/2010 | Hashio et al. | |
| 2013/0265057 A1* | 10/2013 | Sugimori | G01R 1/04 324/426 |
| 2016/0061865 A1* | 3/2016 | Sugimori | G01R 1/04 324/126 |

FOREIGN PATENT DOCUMENTS

| | | |
|---|---|---|
| JP | H11-308156 A | 11/1999 |
| JP | 2003-121476 A | 4/2003 |
| JP | 2005-116713 A | 4/2005 |
| JP | 2009-139272 A | 6/2009 |
| JP | 2010-085381 A | 4/2010 |
| JP | 2011-027679 A | 2/2011 |
| JP | 2011-179824 A | 9/2011 |
| WO | 2011/090167 A1 | 7/2011 |

OTHER PUBLICATIONS

Japanese Office Action dated May 24, 2016 in the counterpart Japanese patent application.

* cited by examiner

STRUCTURE OF MOUNTING CURRENT SENSOR TO BATTERY CABLE

CROSS REFERENCE TO RELATED APPLICATION

The present application is a divisional of the U.S. application Ser. No. 13/855,785 filed on Apr. 3, 2013, the entire contents of which is incorporated herein by reference. This application is based upon and claims the benefit of priority from the prior Japanese Patent Application No. 2012-086000, filed on Apr. 5, 2012, the entire contents of which are incorporated herein by reference.

BACKGROUND

1. Technical Field

The disclosure relates to a structure and a method of mounting a current sensor to a battery cable, and relates particularly to one which sandwiches a battery cable between a housing and a holder of a current sensor and mounts the current sensor to the battery cable.

2. Related Art

In a related structure 300 of mounting a current sensor to a battery cable, as shown in FIGS. 1A to 1D, a battery cable 302 is inserted from its front end through a through-hole 306 of a housing 304 of a current sensor 308, the battery cable 302 is then tightened with a binding band 310, and the battery cable 302 is mounted to the current sensor 308 (the housing 304) (for example, see Japanese Patent Laid-Open Publication No. 2011-179824). At this time, variation in the thickness and shape of the battery cable 302 is absorbed by the binding band 310.

In the related current sensor 308, a current flowing through the battery cable 302 is detected by using a core 312, for example (for example, see Japanese Patent Laid-Open Publication No. 2003-121476). To describe more specifically, in the current sensor 308, the battery cable 302 is inserted through a core (magnetic body) 312 having a gap portion 314 and formed into a C-shape, and a current detecting part (current detection element) 316 is provided in the gap portion 314.

A magnetic field generated by the current flowing through the battery cable 302 is amplified by the core 312, and the current (for example, a current value) flowing through the battery cable 302 is detected (for example, measured) by the current detecting part 316.

Other patent documents related to the pertinent art include JP 2009-139272 A and JP 2010-085381 A.

SUMMARY

In the related structure 300 of mounting a current sensor to a battery cable, since the current is detected by using the core 312, even if a positional deviation of the battery cable 302 occurs when the battery cable 302 is mounted, a detection error of a current value affected by the positional deviation is small (namely, the detection error falls within an allowable range).

However, when the magnetic field generated by the current flowing through the battery cable is measured by using a coreless current sensor, the detection error in the current sensor is increased by the positional deviation of the battery cable relative to the current sensor.

The coreless current sensor is a sensor which detects the current flowing through the battery cable without using an annular core.

In the coreless current sensor, the magnetic field generated by the current flowing through the battery cable is directly detected by a small flat plate-shaped current detecting part mounted near the battery cable (the current detecting part is small in comparison with the core 312), and the detected magnetic field is amplified by using IC and so on.

A large detection error may occur not only in the case of using the coreless current sensor but also in the case of using another current sensor such as a current sensor using a core, although in varying degrees.

The disclosure provides a structure and a method of mounting a current sensor to a battery cable which can realize, when a current sensor is mounted to a battery cable, a proper positional relationship between the battery cable and the current sensor without being affected by a variation in the thickness and shape of the battery cable.

A structure of mounting a current sensor to a battery cable in accordance with some embodiments includes a battery cable, a thermal fusion bonding tape wound around an outer circumference of the battery cable, and a current sensor. The current sensor includes a housing including a current detecting part configured to detect a current flowing through the battery cable, and a holder configured to hold and compress a thermal fusion bonding tape mounting portion in cooperation with the housing to deform a cross-sectional shape of the thermal fusion bonding tape mounting portion into an elliptical shape. The thermal fusion bonding tape mounting portion is a portion where the thermal fusion bonding tape is wound around the battery cable. Upon a compression between the housing and the holder being released, the elliptical shape of the cross-sectional shape of the thermal fusion bonding tape mounting portion is maintained.

The housing may include a housing body including the current detecting part, and a cover disposed separated from the current detecting part and mounted to the housing body to cover the current detecting part. The thermal fusion bonding tape mounting portion may be held between the holder and the cover.

The structure may further include a soft filler filled between the current detecting part and the cover.

A method of mounting a current sensor to a battery cable in accordance with some embodiments includes mounting a thermal fusion bonding tape to an outer circumference of a battery cable, sandwiching and compressing a thermal fusion bonding tape mounting portion between a housing and a holder of a current sensor, and fixing the thermal fusion bonding tape mounting portion to the housing, the thermal fusion bonding tape mounting portion being a portion where the thermal fusion bonding tape is mounted to the battery cable, heating and softening the thermal fusion bonding tape after the fixing of the thermal fusion bonding tape mounting portion to the housing, and curing the thermal fusion bonding tape after the softening of the thermal fusion bonding tape.

A structure of mounting a current sensor to a battery cable in accordance with some embodiments is produced by mounting a thermal fusion bonding tape to an outer circumference of a battery cable, sandwiching and compressing a thermal fusion bonding tape mounting portion between a housing and a holder of a current sensor, and fixing the thermal fusion bonding tape mounting portion to the housing, the thermal fusion bonding tape mounting portion being a portion where the thermal fusion bonding tape is mounted to the battery cable, heating and softening the thermal fusion bonding tape after the fixing of the thermal fusion bonding tape mounting portion to the housing, and curing the thermal fusion bonding tape after the softening of the thermal fusion bonding tape.

The housing may include a housing body including a current detecting part configured to detect a current flowing through the battery cable, and a cover disposed separated from the current detecting part and mounted to the housing body to cover the current detecting part. The thermal fusion bonding tape mounting portion may be held between the holder and the cover.

The structure may further include a soft filler filled between the current detecting part and the cover.

According to some embodiments of the invention, when a current sensor is mounted to a battery cable, a proper positional relationship between the battery cable and the current sensor can be realized without being affected by a variation in the thickness and shape of the battery cable.

BRIEF DESCRIPTION OF DRAWINGS

FIG. 1A is a front view, FIG. 1B is a side view, FIG. 1C is a view showing an IC-IC cross section in FIG. 1A, and FIG. 1D is a view showing a core as viewed from an ID direction of FIG. 1C;

FIG. 3A is a view showing a state in which a cover is removed from a housing body, and FIG. 3B is a view showing a state in which the cover is mounted to the housing body;

FIG. 6A is an exploded perspective view of a holder body and a shield member of the holder, FIG. 6B is a front view of the holder when the holder body and the shield member of the holder are exploded, and FIG. 6C is a front view of the holder.

DETAILED DESCRIPTION

Figure 1A:
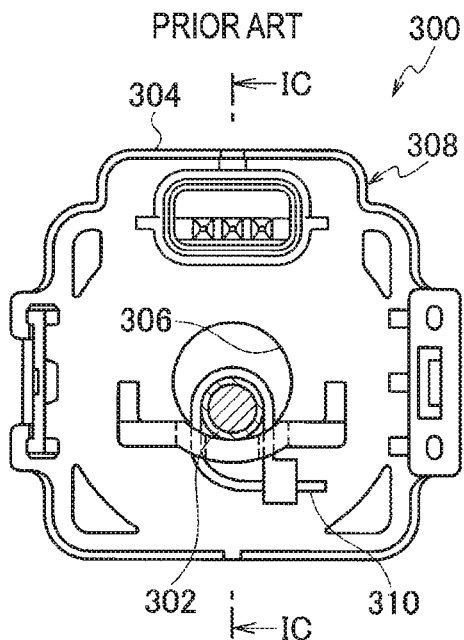
FIGS. 1A to 1D are views showing a schematic configuration of the related structure of mounting a current sensor to a battery cable.
Figure 1B:
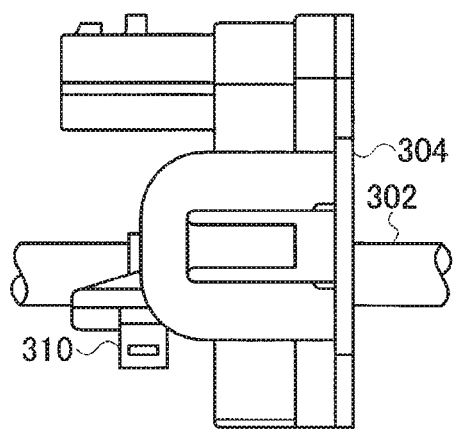
Figure 1C:
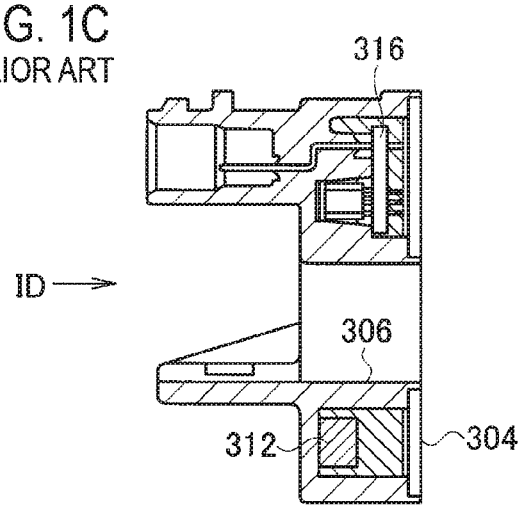
Figure 1D:
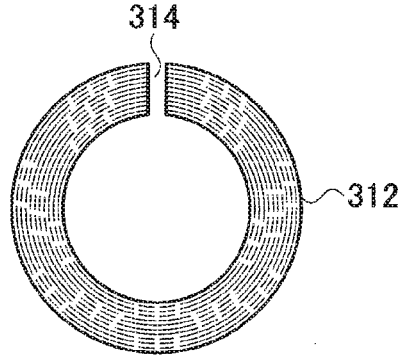
Figure 2:
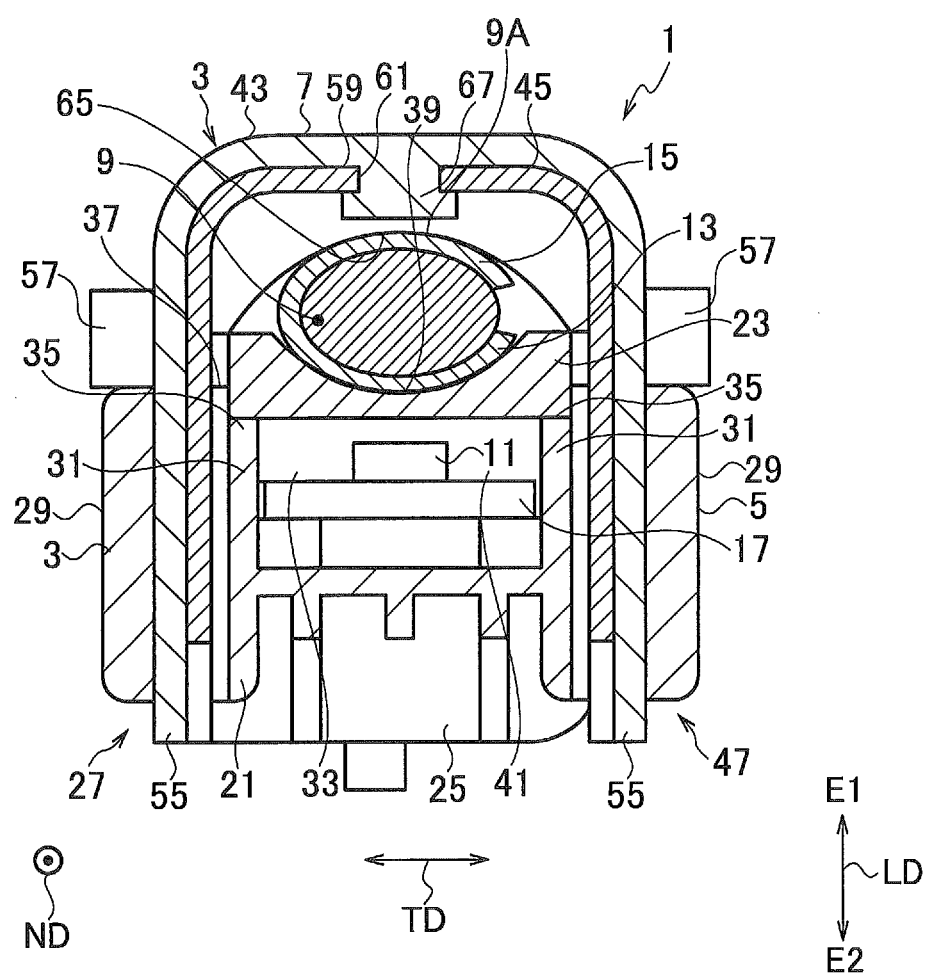
FIG. 2 is a cross-sectional view showing a schematic configuration of a current sensor mounting structure for a battery cable according to an embodiment of the invention.

A current sensor 3 used in a structure of mounting a current sensor to a battery cable 1 (hereinafter referred to as a current sensor mounting structure 1) and a method of mounting a current sensor to a battery cable according to an embodiment of the invention is constituted of a housing (enclosure) 5 and a holder (fixing material) 7 as shown in FIG. 2, for example. The housing 5 includes a current detecting part 11 which detects a current flowing through a core wire of a battery cable 9 of a vehicle and so on.

The battery cable 9 is constituted of an electrically conductive core wire (not shown) and an insulating coating portion (not shown) and has some degree of flexibility. The core wire is formed by, for example, twisting wires (formed of metal such as copper). The coating portion is formed of a synthetic resin such as polyvinyl chloride and coats the core wire.

The cross section of the battery cable 9 (cross section in a plane perpendicular to a longitudinal direction) has a circular shape in a normal condition (for example, in such a state that the current sensor 3 is not mounted). To describe further, the cross section of the core wire has a substantially circular shape, and the cross section of the coating portion has an annular shape in which the inner diameter is equal to the outer diameter of the core wire. The outer circumference of the coating portion is the outer circumference of the battery cable.

In this embodiment, although the battery cable 9 will be described taking as an example, the current sensor mounting structure 1 may be applied to a cable (electric wire) other than the battery cable.

Figure 5:
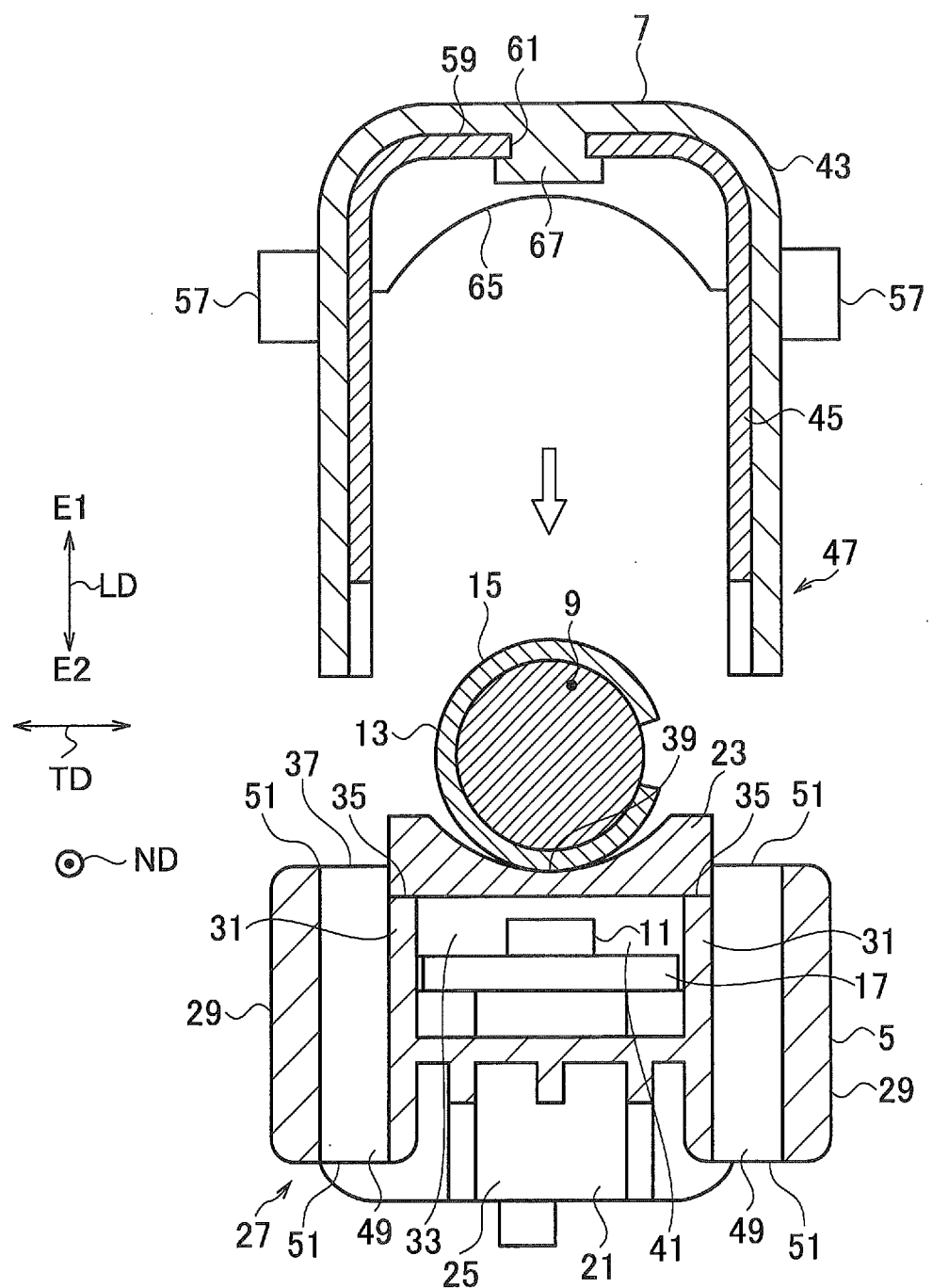
FIG. 5 is a view corresponding to FIG. 2 and showing a state before a battery cable is sandwiched between a housing and a holder in the current sensor mounting structure for a battery cable according to the embodiment of the invention.

In the current sensor mounting structure 1, first, as shown in FIG. 5, a thermal fusion bonding tape 13 is mounted to the outer circumference of the battery cable 9 (for example, the thermal fusion bonding tape 13 is wound around the outer circumference of the battery cable 9), and a thermal fusion bonding tape mounting portion 15 where the thermal fusion bonding tape 13 is mounted is compressed by being sandwiched between the housing 5 of the current sensor (for example, a coreless current sensor) 3 and the holder (also referred to as a holder assay or a holder assembly) 7. For example, the holder 7 is mounted integrally to the housing 5, whereby the thermal fusion bonding tape mounting portion 15 is compressed by being sandwiched between the housing 5 and the holder 7.

As shown in FIG. 2, the thermal fusion bonding tape mounting portion 15 is fixed to the housing 5 and the holder 7 (namely, the current sensor 3 is fixed to the thermal fusion bonding tape mounting portion 15) (for example, the housing 5 and the holder 7 are provided integrally with each other), and then the thermal fusion bonding tape 13 is heated by, for example, being sprayed with hot air to be temporarily softened, and, thus, to be cooled after softening, whereby the thermal fusion bonding tape 13 is cured. The current sensor mounting structure 1 is configured in this manner.

The current sensor 3 is mounted near an end in the longitudinal direction of the battery cable 9 or an intermediate portion of the battery cable 9. As described above, the thermal fusion bonding tape mounting portion 15 is sandwiched between the housing 5 and the holder 7 to fix the current sensor 3 to the battery cable 9, and after the thermal fusion bonding tape 13 is softened and cured, the current detecting part 11 detects the current flowing through the core wire of the battery cable 9.

Figure 7:
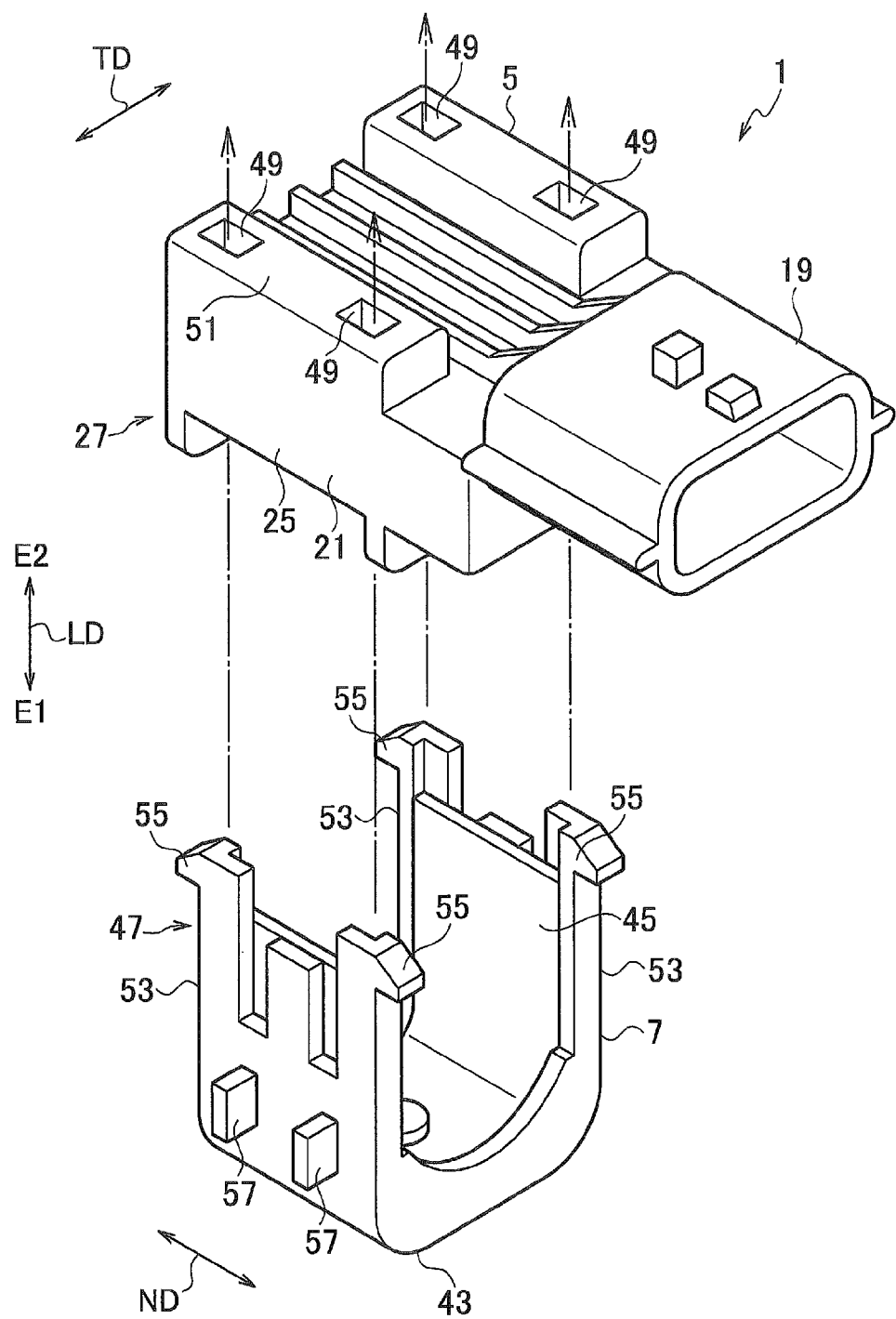
FIG. 7 is an exploded perspective view of the housing and the holder in the current sensor of the battery cable according to the embodiment of the invention.

The current value detected by the current detecting part 11 is amplified through, for example, a circuit of a substrate 17 of the housing 5 and output through a cable (not shown) connected to a connector portion 19 (see, FIG. 7).

The thermal fusion bonding tape 13 is mounted so as to cover the coating portion of the battery cable 9. Namely, in the thermal fusion bonding tape mounting portion 15, the core wire is covered with the coating portion, and the coating portion is covered with the thermal fusion bonding tape 13. The thermal fusion bonding tape mounting portion 15 may have a configuration in which the coating portion is removed over a predetermined length of the battery cable 9 to expose the core wire, and the thermal fusion bonding tape 13 is directly wound around the outer circumference of the exposed core wire, for example, whereby the thermal fusion bonding tape mounting portion 15 is provided.

In such a state that the housing 5 and the holder 7 are fixed to the thermal fusion bonding tape mounting portion 15, as shown in FIG. 2, the thermal fusion bonding tape 13 and the battery cable 9 are compressed by the housing 5 and the holder 7, whereby the cross-sectional shape of the thermal fusion bonding tape mounting portion 15 (the cross-sectional shapes of the thermal fusion bonding tape 13 and the battery cable 9) in a plane perpendicular to the longitudinal direction of the battery cable 9 is an elliptical shape being a collapsed circle. To describe further, the coating portion of the battery cable 9 has an elliptical ring shape and surrounds the elliptical core wire, and the thermal fusion bonding tape 13 has an elliptical ring shape and surrounds the elliptical battery cable 9.

The elliptical shape of the thermal fusion bonding tape mounting portion 15 compressed by the housing 5 and the holder 7 is hardly changed even if the thermal fusion bonding tape 13 is heated and softened. Further, the elliptical shape is hardly changed even if the thermal fusion bonding tape 13 is cooled and cured.

Even in such a state that the thermal fusion bonding tape 13 is cooled and cured, the battery cable 9 and the thermal fusion bonding tape 13 are sandwiched between the housing 5 and the holder 7, and the housing 5 and the holder 7 are fixed to the thermal fusion bonding tape mounting portion 15 (the thermal fusion bonding tape 13).

Although the thermal fusion bonding tape 13 of this embodiment is mounted in the form of C-shape having in its part an unmounted portion as viewed from the longitudinal direction of the battery cable 9, the thermal fusion bonding tape 13 may have a configuration in which a single layer or multilayer of the thermal fusion bonding tape 13 is wound around the battery cable 9 (namely, the thermal fusion bonding tape 13 having a cylindrical shape is provided).

To further describe the current sensor mounting structure 1, the current sensor mounting structure 1 includes the housing 5, the thermal fusion bonding tape 13, and the holder 7 as described above.

The housing 5 includes the current detecting part 11 which detects the current flowing through the core wire of the battery cable 9. The thermal fusion bonding tape 13 is wound around the outer circumference of the battery cable 9.

The holder 7 sandwiches and compresses the thermal fusion bonding tape mounting portion 15 wound with the thermal fusion bonding tape 13 in cooperation with the housing 5 and deforms the cross-sectional shape of the thermal fusion bonding tape mounting portion 15 in the plane perpendicular to the longitudinal direction of the battery cable 9 into an elliptical shape.

In the current sensor mounting structure 1, when the above compression between the housing 5 and the holder 7 is released, the elliptical shape of the cross-sectional surface of the thermal fusion bonding tape mounting portion 15 is maintained.

Namely, in the current sensor mounting structure 1, even if the holder 7 is separated from the housing 5 from such a state that the thermal fusion bonding tape mounting portion 15 is deformed by being sandwiched between the housing 5 and the holder 7 to thereby stop the sandwiching of the thermal fusion bonding tape mounting portion 15 and, thus, to eliminate the compression of the thermal fusion bonding tape mounting portion 15, although the cross-sectional shape of the thermal fusion bonding tape mounting portion 15 is slightly deformed, the elliptical shape at the time when the thermal fusion bonding tape mounting portion 15 is sandwiched is substantially maintained.

Such a phenomenon that the elliptical shape is maintained occurs in, for example, the softening and curing of the thermal fusion bonding tape 13 described above. Namely, in such a state that the thermal fusion bonding tape mounting portion 15 is deformed by being sandwiched between the housing 5 and the holder 7, the thermal fusion bonding tape 13 is heated to be softened and, thus, to be cured after the softening, whereby an internal stress of the thermal fusion bonding tape 13 is changed, so that the above phenomenon occurs.

In the current sensor mounting structure 1, the housing 5 includes a housing body (enclosure body) 21 and a cover 23. The current detecting part 11 which detects the current flowing through the core wire of the battery cable 9 is provided in the housing body 21.

The cover 23 is mounted integrally to the housing body 21 so as to separate from the current detecting part 11 and cover the current detecting part 11.

The thermal fusion bonding tape mounting portion 15 is held between the holder 7 and the cover 23 mounted integrally to the housing body 21, whereby the current sensor 3 is mounted integrally to the battery cable 9.

In the current sensor mounting structure 1, a soft filler (such as a soft synthetic resin and a soft rubber) 41 is filled between the current detecting part 11 and the cover 23 inside the housing body 21, for example.

The current sensor mounting structure 1 will be described more specifically. For the convenience of explanation, a predetermined direction in a space is represented by a lateral direction TD, a direction perpendicular to the lateral direction TD is represented by a longitudinal direction LD, and a direction perpendicular to the lateral direction TD and the longitudinal direction LD is represented by a length direction ND (coinciding with the length direction of the battery cable 9).

As described above, the current sensor 3 includes housing 5, the holder 7, the current detecting part 11, and the substrate 17.

The housing 5 includes the housing body 21 and the cover 23, which is constructed separately from the housing body 21, for example.

The housing body 21 and the cover 23 are formed by integrally forming a material such as an insulating synthetic resin.

The housing body 21 is provided with a housing body 25, the connector portion 19, a retaining portion 27, a stopper abutting portion 29, and a cover abutting portion 31.

A recess 33 having, for example, a rectangular shape (rectangular solid shape) is formed in the central portion of the housing body 21 (the housing body 25), and the substrate 17 and the current detecting part 11 are provided in the recess 33. The substrate 17 and the current detecting part 11 are integrally provided in the housing body 21.

The recess 33 has an opening on one end side in the longitudinal direction LD (the upper side of FIGS. 2, 3A, and 3B and one end side E1), and a current detecting portion of the current detecting part 11 faces the one end side in the longitudinal direction LD.

The connector portion 19 projects from the housing body 25 in the longitudinal direction of the housing body 21, as shown in FIG. 7.

The retaining portion 27 is provided, for example, near four corners of the recess 33, as shown in FIG. 7. The details of the retaining portion 27 will be described later. The stopper abutting portion 29 projects from the housing body 25 on the both sides in the lateral direction TD of the housing body 21, as shown in FIG. 2.

The cover abutting portion 31 is formed in the recess 33, as shown in FIG. 2. The cover abutting portion 31 projects toward the center of the recess 33 from an inner wall of the recess 33 on the both sides in the lateral direction TD of the housing body 21 and is, for example, formed as a pair of cover abutting portions. An upper surface 35 of the cover abutting portion 31 has a planar shape and is more depressed than the opening 37 of the recess 33. The opening 37 of the recess 33 and the upper surface 35 of the cover abutting portion 31 form a step. Although the cover abutting portion 31 is provided on the both sides in the lateral direction TD of the housing body 21, instead of that or in addition to that, the cover abutting portion 31 may be provided projecting toward the center of the recess 33 from the inner wall of the recess 33 on the both sides in the length direction ND of the housing body 21.

Although the cover 23 is formed into a planar shape, an elliptical (or circular-arc) hollow 39 is formed in one surface in the thickness direction (a surface on one end side in the longitudinal direction in FIG. 5 and so on). The dimension in the lateral direction TD of the cover 23 is substantially equal to the dimension in the lateral direction TD of the recess 33 (portion near the opening 37 in which the cover abutting portion 31 is not formed).

When the cover 23 is mounted in the recess 33 of the housing body 25 so that the other surface in the thickness direction of the cover 23 faces the recess 33 of the housing body 25 (see, FIGS. 3A and 3B), a surface near the both ends in the lateral direction TD of the cover 23 (a portion of the other surface in the thickness direction) is abutted against the cover abutting portion 31, and the both end surfaces in the lateral direction TD of the cover 23 are abutted against a wall surface of the recess 33, whereby the cover 23 slots into the housing body 21, so that the cover 23 is mounted integrally to the housing body 21 (the housing body 25).

In such a state that the cover 23 is mounted to the housing body 21, the hollow 39 of the cover 23 extends in the length direction ND, and a gap is formed between the cover 23 and the current detecting part 11. The gap is filled with the soft filler 41, for example.

In such a state that the cover 23 is mounted to the housing body 21, the cover 23 slightly projects relative to the opening of the recess 33, so that the cover 23 cannot be moved any further toward the bottom of the recess 33 (the other end side in the longitudinal direction LD, the lower sides of FIGS. 2 and 3, and the other end side E2) by the cover abutting portion 31.

As shown in FIG. 6, the holder 7 includes a holder body (fixing material body) 43 and a shield member (for example, a shield plate) 45 formed integrally with the holder body 43.

As described above, the holder 7 is mounted integrally to the housing 5 and sandwiches the battery cable 9 in cooperation with the housing 5.

The holder body 43 and the shield plate 45 are previously integrated to form the holder 7, and the holder 7 is mounted to the housing 5.

The holder 7 (for example, the holder body 43) includes a retained portion 47. During when the holder 7 is mounted integrally to the housing 5 (that is, when the holder 7 is linearly moved in a direction close to the housing 5 so that the holder 7 in a state of being separated from the housing 5 is mounted integrally to the housing 5), the retained portion 47 of the holder 7 is abutted against the retaining portion 27 of the housing 5 and thereby elastically deformed.

Once the holder 7 is mounted integrally to the housing 5 (that is, upon completion of the mounting after termination of the linear movement), the retained portion 47 is restored and then anchored to the retaining portion 27, and the holder 7 is mounted integrally to the housing 5, so that holder 7 and the housing 5 sandwich the battery cable 9.

As shown in FIG. 7, the retaining portion 27 of the housing 5 (the retaining portion provided in the housing 5) has four through-holes (retained portion insertion holes) 49, for example, which penetrate through the housing 5 (the housing body 25) in the longitudinal direction LD and a pair of planar portions (an abutting portion of a claw portion of the retained portion and a stopper abutting portion of the retaining portion) provided around openings at the both ends of the through-holes 49 and provided in the housing body 25.

The through-holes 49 are provided outside the recess 33 of the housing body 25 and adjacent to four corners of the housing body 25 and penetrate through the housing body 25 in the longitudinal direction LD.

The retained portion 47 of the holder 7 (for example, a retained portion of the holder body 43) includes elastic portions 53 projecting from the holder 7, claw portions (snap fit portions) 55 each provided at a front end of the elastic portion 53, and stopper portions 57 of the holder 7 provided on the base end side of the elastic portion 53.

Figures 6A, 6B:
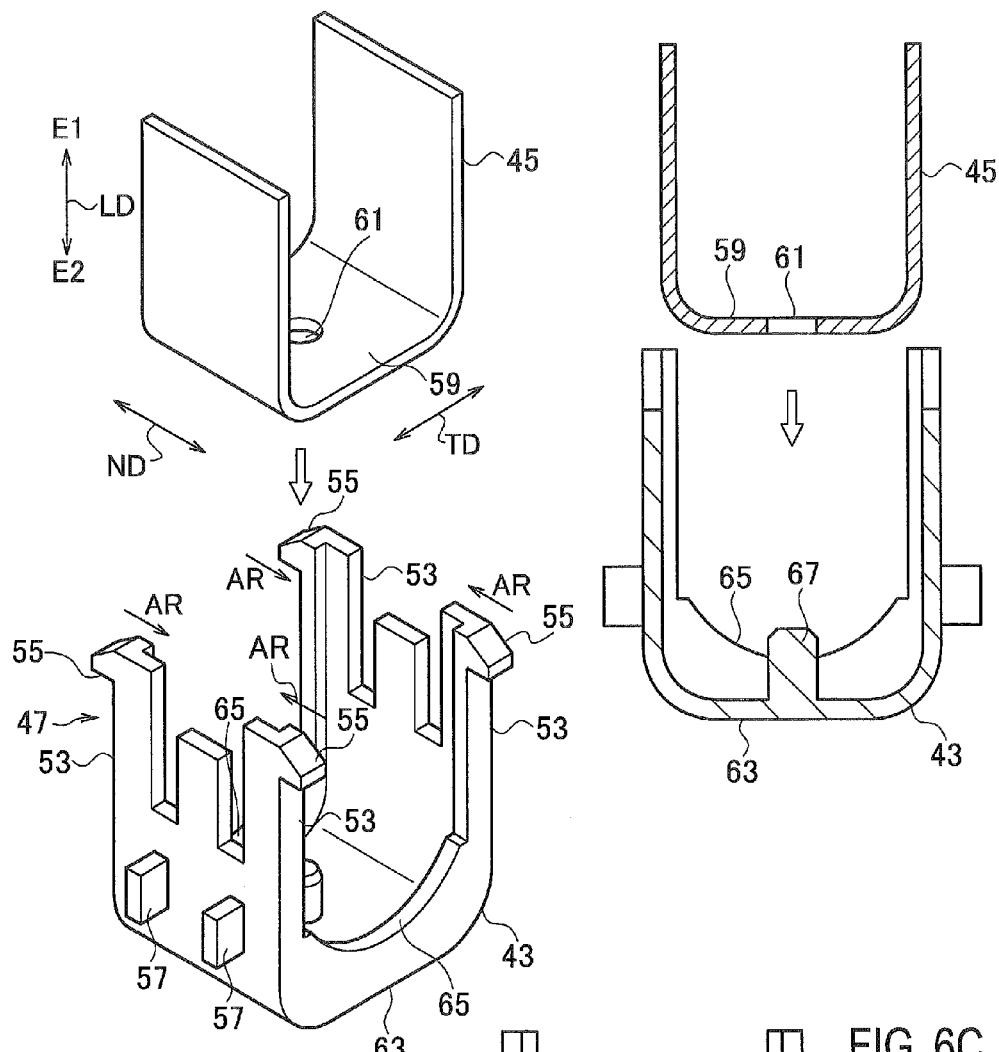
FIGS. 6A to 6C are views showing a schematic configuration of the holder in the current sensor mounting structure for a battery cable according to the embodiment of the invention.

To further describe the holder 7, in the shield plate 45, as shown in FIG. 6A, a rectangular plate-shaped material formed of an electrically conductive material such as metal is bent at two portions, whereby the shield plate 45 is formed into a U-shape. A top plate portion 59 of the shield plate 45 has a through-hole 61.

The holder body 43 is formed into a substantially U-shape. To further describe, the holder body 43 includes a holder body portion 63 formed into a rectangular box shape, an elliptical arc portion (recess) 65, and a protrusion 67. The elliptical arc portion 65 is provided on the opening side of the holder body portion 63 (on the other end side in the longitudinal direction LD of the holder body portion 63) and provided in a pair of side wall portions (side wall portions of the holder body portion 63) existing at the both ends in the length direction ND of the holder 7.

The elastic portion 53 is formed into a bar shape and projects from the four corners of the holder body portion 63 toward the opening portion of the holder body portion 63 (toward the other end in the longitudinal direction LD of the holder body portion 63).

The protrusion 67 is provided at the top plate portion of the holder body portion 63. The protrusion 67 exists inside the box-shaped holder body portion 63.

The shield member 45 is inserted into the holder body 43, and the protrusion 67 is inserted through the through-hole 61. Then, a front end of the protrusion 67 is caulked by, for example, ultrasound. Consequently, the holder body 43 and the shield member 45 are integrated to form the holder 7 having a substantially U-shape.

In the holder 7, the elastic portion 53 is separated from the shield member 45 in the length direction ND. Accordingly, the elastic portion 53 can be elastically deformed by flexing in the length direction ND of the holder 7. The claw portion 55 projects outside the holder 7 relative to the elastic portion 53 in the length direction ND of the holder 7.

During when the holder 7 is mounted integrally to the housing 5, the claw portion 55 and a front end side portion of the elastic portion 53 are inserted into the through-hole 49, so that the elastic portion 53 is elastically deformed (flexing inside the holder 7) by a reaction force received from the housing 5.

Once the holder 7 is mounted integrally to the housing 5, the claw portions 55 are removed from the through-holes 49 and abutted against one of the pair of planar portions 51, and the elastic portion 53 is restored and, at the same time, located in the through-hole 49. Meanwhile, the stopper portion 57 is abutted against the other one of the pair of planar portions 51. According to this constitution, the housing 5 (the housing body 21) is sandwiched between the claw portion 55 and the stopper portion 57, so that the holder 7 is mounted integrally to the housing 5.

The operation of mounting the current sensor 3 to the battery cable 9 will be described.

Figure 6C:
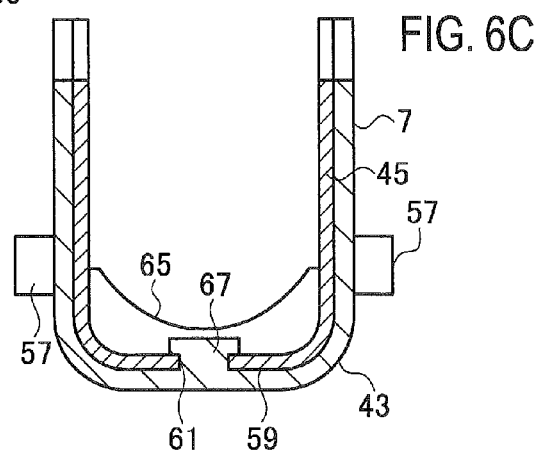

It is assumed that the holder 7 is previously assembled in the aspects shown in FIGS. 6A to 6C.

Figure 3A:
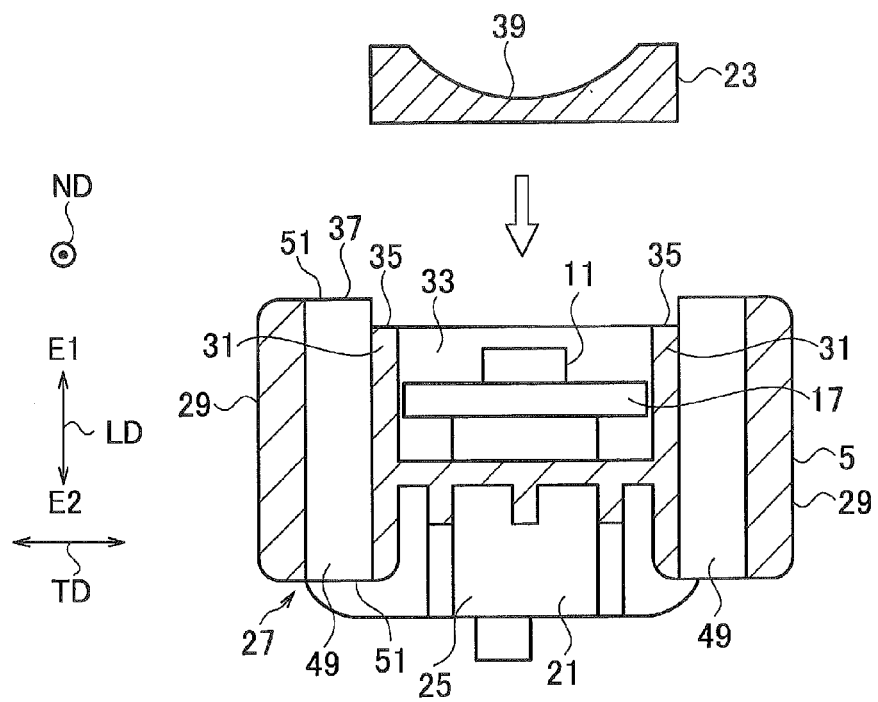
FIGS. 3A and 3B are views corresponding to FIG. 2 and showing a schematic configuration of a housing of a current sensor used in the current sensor mounting structure for a battery cable according to the embodiment of the invention.
Figure 3B:
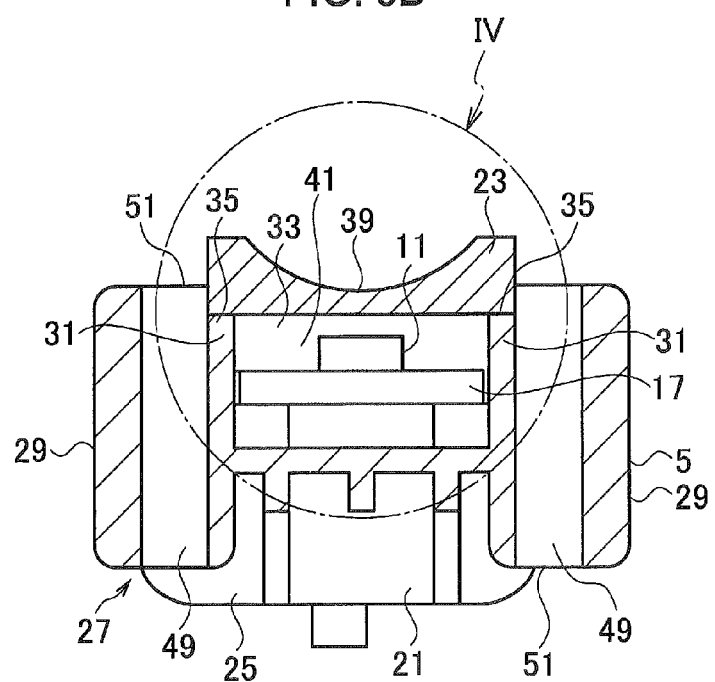
Figure 4:
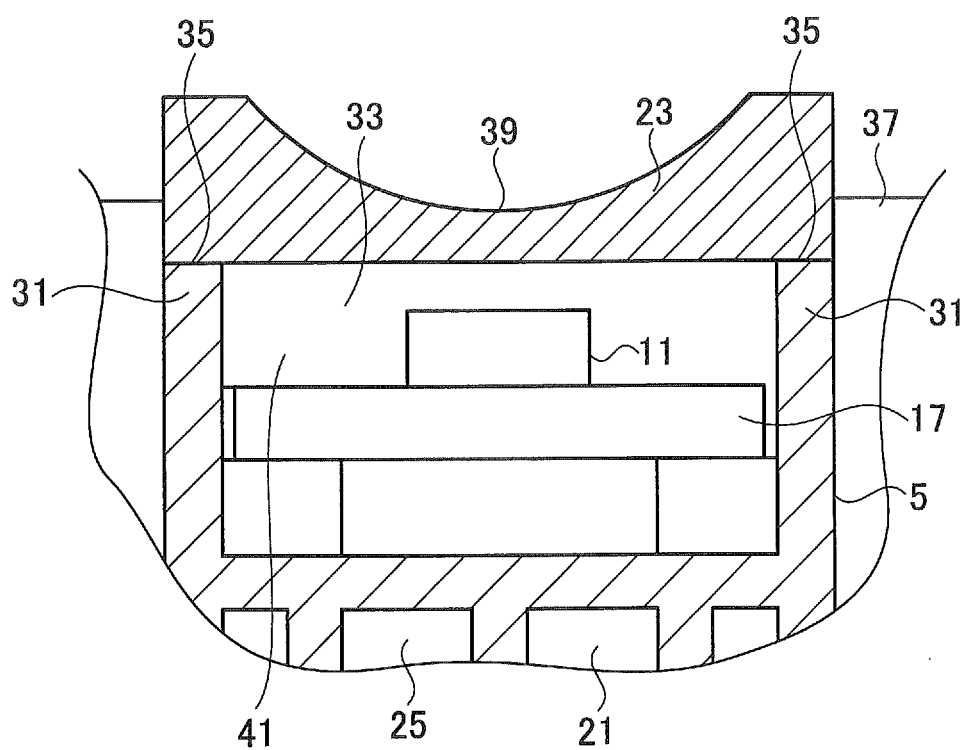
FIG. 4 is an enlarged view of an IV portion in FIG. 3B.

As shown in FIGS. 3A, 3B, and 4, the cover 23 is mounted to the holder body 43. The thermal fusion bonding tape 13 is mounted at a portion of the battery cable 9 where the current sensor 3 is mounted.

As shown in FIG. 5, the thermal fusion bonding tape mounting portion 15 mounted with the thermal fusion bonding tape 13 is placed in the hollow 39 of the housing 5 (the cover 23). Subsequently, as shown in FIGS. 5 and 7, the holder 7 is brought close to the housing 5, the holder 7 is mounted to the housing 5, and the thermal fusion bonding tape mounting portion 15 is pressed by being sandwiched between the holder 7 and the housing 5 (see, FIG. 2).

As shown in FIGS. 5 and 7, when the holder 7 is brought close to the housing 5, the thermal fusion bonding tape mounting portion 15 is self-aligned by the hollow 39 of the cover 23 and the recess 65 of the holder 7. In the state shown in FIG. 2, the thermal fusion bonding tape mounting portion 15 is in contact with the hollow 39 of the cover 23 and the recess 65 of the holder 7.

In the above case, the hollow 39 is formed throughout the length in the length direction ND of the cover 23, and the recess 65 is formed at only both the ends in the length direction ND of the holder 7 (see, FIG. 6A). Therefore, an upper portion 9A of the battery cable 9 shown in FIG. 2 expands further upward than the state shown in FIG. 2 between a pair of the recesses because the recess 65 does not exist. Namely, the cross-sectional shape of the thermal fusion bonding tape mounting portion 15 changes in the length direction ND, whereby the current sensor 3 mounted to the battery cable 9 is more reliably secured in the length direction ND of the battery cable 9.

In the state shown in FIG. 2, the thermal fusion bonding tape 13 is heated and softened, and thereafter, the thermal fusion bonding tape 13 is cured to terminate the mounting of the current sensor 3 to the battery cable 9, and, thus, to produce the current sensor mounting structure 1.

According to the current sensor mounting structure 1, since the current sensor 3 is mounted to the battery cable 9, using the thermal fusion bonding tape 13, even if the thickness and shape of the battery cable 9 are varied, a proper positional relationship between the battery cable 9 and the current sensor 3 (the current detecting part 11) can be realized without being affected by the variation.

Namely, even if the thickness and shape of the battery cable 9 are varied, since the variation is absorbed by, for example, the thermal fusion bonding tape 13 (for example, the variation is absorbed by the mounting thickness of the thermal fusion bonding tape 13 or by softening and curing the thermal fusion bonding tape 13), when the current sensor 3 is mounted to the battery cable 9, a proper positional relationship between the battery cable 9 and the current sensor 3 can be realized. The detection accuracy of the current sensor 3 can be stabilized and enhanced.

Since the coreless current sensor is used as the current sensor 3, a distance between a portion holding the battery cable 9 and the current detecting part 11 is reduced than ever before. Namely, a distance between the battery cable 9 fixed by being held between the cover 23 of the housing 5 and the holder 7 is reduced than ever before. According to this constitution, the current sensor 3 can be miniaturized.

According to the current sensor mounting structure 1, the cover 23 is provided, and since the battery cable 9 is sandwiched between the cover 23 and the holder 7, even if a force is applied to the current sensor 3 by, for example, flexure of the battery cable 9 when the current sensor 3 is mounted to the battery cable 9, stress generated in the cover 23 of the current sensor 3 by the force hardly reaches the current detecting part 11, and the current detecting part 11 can be protected.

Meanwhile, in the related structure 300 of mounting a current sensor to a battery cable shown in FIGS. 1A to 1D, the current detecting part 316 is positioned by the housing 304, and the current detecting part 316 is embedded with a resin such as urethane as a measure of waterproofing and dust-proofing. However, since the battery cable 302 passes through the through-hole 306 in such a state that a space is formed (in a hollow state), even if the battery cable 302 flexes, the stress according to the flexure is hardly generated in the housing 304 of the current sensor 308.

In the current sensor mounting structure 1, if a current detecting part is embedded with a resin such as urethane as in the related current sensor 308 shown in FIGS. 1A to 1D, when a force is applied to the current sensor by, for example, flexure of the battery cable, stress is transmitted to the current detecting part.

However, since the cover 23 is provided as described above, if a force is applied to the current sensor 3 by, for example, the flexure of the battery cable 9, the force hardly reaches the current detecting part 11.

According to the current sensor mounting structure 1, since a space between the current detecting part 11 and the cover 23 is filled with the soft filler 41, the current detecting part 11 can be rendered waterproof and dust-proof. In addition, even if a force is applied to the current sensor 3 by, for example, the flexure of the battery cable 9 when the current sensor 3 is mounted to the battery cable 9, the stress generated in the cover 23 of the current sensor 3 is absorbed by the soft filler 41 and hardly reaches the current detecting part 11.

In the current sensor mounting structure 1, the thermal fusion bonding tape 13 may be omitted. In this case, heating and cooling are not required to be performed after the battery cable 9 is sandwiched between the housing 5 and the holder 7.

Although the embodiments of the present invention has been described above, the invention is not limited to the above embodiment, and various modifications are possible.

What is claimed is:

1. A structure of mounting a current sensor to a battery cable, the structure comprising:
   the battery cable;
   a thermal fusion bonding tape wound around an outer circumference of the battery cable; and
   the current sensor comprising
     a housing including a current detecting part configured to detect a current flowing through the battery cable, and a holder mounted to the housing with the thermal fusion bonding tape and the battery cable being arranged between the housing and the holder, wherein the housing and the holder is configured to sandwich, compress, and deform the thermal fusion bonding tape and the battery cable, a cross-sectional shape of the thermal fusion bonding tape deformed by the housing and the holder is an elliptical shape, a cross-sectional shape of the battery cable deformed by the housing and the holder is an elliptical shape, and the thermal fusion bonding tape with the cross-sectional shape of the elliptical shape is cured.

2. The structure of mounting a current sensor to a battery cable according to claim 1, wherein the housing comprises a housing body including the current detecting part, and a cover disposed separated from the current detecting part and mounted to the housing body to cover the current detecting part, and wherein the thermal fusion bonding tape and the battery cable are held between the holder and the cover.

3. The structure of mounting a current sensor to a battery cable according to claim 2, further comprising a soft filler filled between the current detecting part and the cover.

4. The structure of mounting a current sensor to a battery cable according to claim 3, wherein the soft filler comprises one of: a soft synthetic resin; and a soft rubber.

5. The structure of mounting a current sensor to a battery cable according to claim 1, wherein the current sensor is mounted near an end in a longitudinal direction of the battery cable.

6. The structure of mounting a current sensor to a battery cable according to claim 1, wherein the current sensor is mounted at an intermediate portion of the battery cable.

7. The structure of mounting a current sensor to a battery cable according to claim 1, wherein the battery cable comprises: a core wire; and a coating portion, and the thermal fusion bonding tape is mounted so as to cover the coating portion.

8. The structure of mounting a current sensor to a battery cable according to claim 1, wherein the holder, in a condition of holding and compressing, maintains a positional relationship between the battery cable and the current detecting part that is not affected by variation in a thickness or shape of the battery cable.

9. The structure of mounting a current sensor to a battery cable according to claim 1, wherein directions of minor axes of the elliptical shapes of the thermal fusion bonding tape and the battery cable compressed by the housing and the holder correspond to an arranging direction of the battery cable and the current detecting part.

* * * * *